(12) United States Patent
Hatano

(10) Patent No.: US 9,715,103 B2
(45) Date of Patent: Jul. 25, 2017

(54) DISPLAY DEVICE

(71) Applicant: Semiconductor Energy Laboratory Co., Ltd., Kanagawa-ken (JP)

(72) Inventor: Kaoru Hatano, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/224,742

(22) Filed: Mar. 25, 2014

(65) Prior Publication Data

US 2014/0293192 A1    Oct. 2, 2014

(30) Foreign Application Priority Data

Mar. 27, 2013   (JP) ................. 2013-066119

(51) Int. Cl.
| G02F 1/1335 | (2006.01) |
| G02B 26/00  | (2006.01) |
| H01L 27/32  | (2006.01) |
| H01L 51/52  | (2006.01) |
| G02F 1/13   | (2006.01) |
| G02F 1/15   | (2006.01) |
| G02F 1/157  | (2006.01) |

(52) U.S. Cl.
CPC .......... *G02B 26/005* (2013.01); *H01L 27/326* (2013.01); *H01L 51/524* (2013.01); *H01L 51/5262* (2013.01); *G02F 1/13* (2013.01); *G02F 1/15* (2013.01); *G02F 1/157* (2013.01); *G02F 2201/44* (2013.01)

(58) Field of Classification Search
CPC ................................................ G02F 1/133602
See application file for complete search history.

(56) References Cited

U.S. PATENT DOCUMENTS 6,714,268 B2    3/2004  Wang et al.
6,897,884 B2    5/2005  Tsuge et al.
(Continued)

FOREIGN PATENT DOCUMENTS

EP    1 380 879 A1    1/2004
JP    11-202332 A     7/1999
(Continued)

OTHER PUBLICATIONS

Shieh, H.-P., "Transflective Display by Hybrid OLED and LCD," LEOS 2005 (IEEE Lasers and Electro-Optics Society Annual Meeting), Oct. 22, 2005, pp. 650-651, IEEE.
(Continued)

*Primary Examiner* — Timothy L Rude
(74) *Attorney, Agent, or Firm* — Husch Blackwell LLP

(57) ABSTRACT

A display panel can display images or information on at least one surface side and transmit external light through a transmissive display element. The display panel includes a plurality of light-emitting elements that emit light to the one surface side and can be driven independently and a plurality of transmissive display elements that can be driven independently. Alternatively, a display panel transmits external light through a double-side light-emitting element and a transmissive display element. The display panel includes a plurality of double-side light-emitting elements that can be driven independently and a plurality of transmissive display elements that can be driven independently.

20 Claims, 5 Drawing Sheets

(56) References Cited

U.S. PATENT DOCUMENTS

| | | |
|---|---|---|
| 6,954,239 B2 | 10/2005 | Kato et al. |
| 7,015,997 B2 * | 3/2006 | Choi .................. B82Y 20/00 |
| | | 349/114 |
| 7,038,641 B2 | 5/2006 | Hirota et al. |
| 7,064,740 B2 | 6/2006 | Daly |
| 7,084,936 B2 | 8/2006 | Kato |
| 7,102,704 B2 | 9/2006 | Mitsui et al. |
| 7,176,991 B2 | 2/2007 | Mitsui et al. |
| 7,180,513 B2 | 2/2007 | Tsuge |
| 7,239,361 B2 | 7/2007 | Kato |
| 7,248,235 B2 | 7/2007 | Fujii et al. |
| 7,355,338 B2 | 4/2008 | Osame et al. |
| 7,385,654 B2 | 6/2008 | Mitsui et al. |
| 7,528,812 B2 | 5/2009 | Tsuge et al. |
| 8,044,813 B1 | 10/2011 | Dembo et al. |
| 8,063,855 B2 | 11/2011 | Takahara et al. |
| 8,188,875 B2 | 5/2012 | Dembo et al. |
| 8,242,683 B2 | 8/2012 | Abe et al. |
| 8,330,607 B2 | 12/2012 | Dembo et al. |
| 8,698,978 B2 * | 4/2014 | Fryer ............... G02F 1/133603 |
| | | 349/69 |
| 8,698,979 B2 * | 4/2014 | Zhao ................ G02F 1/133602 |
| | | 349/69 |
| 2003/0103021 A1 | 6/2003 | Young et al. |
| 2003/0201960 A1 | 10/2003 | Fujieda |
| 2003/0210360 A1 | 11/2003 | Yoshida |
| 2005/0030264 A1 | 2/2005 | Tsuge et al. |
| 2005/0041002 A1 | 2/2005 | Takahara et al. |
| 2005/0057580 A1 | 3/2005 | Yamano et al. |
| 2005/0168491 A1 | 8/2005 | Takahara et al. |
| 2005/0180083 A1 | 8/2005 | Takahara et al. |
| 2005/0253789 A1 | 11/2005 | Ikeda |
| 2006/0072047 A1 | 4/2006 | Sekiguchi |
| 2008/0180618 A1 | 7/2008 | Fujieda |
| 2010/0171905 A1 | 7/2010 | Huang et al. |
| 2015/0055061 A1 * | 2/2015 | Johnston ............... G02F 1/1334 |
| | | 349/71 |

FOREIGN PATENT DOCUMENTS

| | | |
|---|---|---|
| JP | 2001-066593 A | 3/2001 |
| JP | 2002-196702 A | 7/2002 |
| JP | 2002-328630 A | 11/2002 |
| JP | 2003-076302 A | 3/2003 |
| JP | 2003-098984 A | 4/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-045769 A | 2/2004 |
| JP | 2004-093754 A | 3/2004 |
| JP | 2004-296162 A | 10/2004 |
| JP | 2007-232882 A | 9/2007 |
| JP | 2008-108616 A | 5/2008 |
| JP | 4161574 B2 | 10/2008 |
| JP | 2013-221965 A | 10/2013 |
| WO | WO 2004-053819 A1 | 6/2004 |
| WO | WO 2004/061806 A1 | 7/2004 |

OTHER PUBLICATIONS

Lee, J-H., et al., "High Ambient-Contrast-Ratio Display Using Tandem Reflective Liquid Crystal Display and Organic Light-Emitting Device," Optics Express, Nov. 14, 2005, vol. 13, No. 23, pp. 9431-9438.

* cited by examiner

DISPLAY DEVICE

BACKGROUND OF THE INVENTION

1. Field of the Invention

One embodiment of the present invention relates to a display panel and a display device, and manufacturing methods of the display panel and the display device. In particular, one embodiment of the present invention relates to a display panel and a display device that transmit visible light, and manufacturing methods of the display panel and the display device.

2. Description of the Related Art

Recent display devices are expected to be applied to a variety of uses and become diversified.

Light-emitting elements utilizing electroluminescence (also referred to as an EL element) have features of the ease to thinning and lightening, high-speed response to input signal, driving with a direct-current low voltage source, and the like; therefore, the light-emitting elements are considered to be applied to display devices (see Patent Document 1 etc.).

Furthermore, display devices that enable a user to see an image on a display portion with his/her front sight overlapped (also can be called display devices having see-through functions or transparent display devices) are desired to be utilized for head-up displays, wearable displays such as head-mount displays, car glass, and the like.

In addition, portable display devices used for wearable displays and the like are required to reduce the power consumption.

REFERENCE

Patent Document

PCT International Publication WO 2004/061806

SUMMARY OF THE INVENTION

The visibility of display devices using light-emitting elements are lowered in bright light as compared with in a dark place, because the difference in brightness between a light-emitting pixel and a non-light-emitting pixel is small.

In view of that, it is an object of one embodiment of the present invention to provide a novel display panel or a novel display device. Further, it is an object of one embodiment of the present invention to provide a display panel with low-power consumption or a display device with low-power consumption. Furthermore, it is an object of one embodiment of the present invention to provide a display panel or a display device having high visibility irrespective of surrounding light conditions. Moreover, it is an object of one embodiment of the present invention to provide a display panel or a display device having high visibility irrespective of surrounding light conditions, in the case of insufficient external light on a user side, for example, in use of a wearable display or the like.

One embodiment of the present invention is a display panel that can display an image or information on at least one surface and transmit external light through a transmissive display element, and the display panel includes a plurality of light-emitting elements that can be driven independently and emit light to one surface side of the display panel and a plurality of transmissive display elements that can be driven independently.

The display panel of one embodiment of the present invention can use a transmissive display element and a light-emitting element to display an image (a still image or a moving image) or information.

In the display panel of one embodiment of the present invention, display performed using the transmissive display element is preferred because external light can be used as a light source and the power consumption of the display panel is low. External light is not required to enter the display panel through a surface of the display panel on the user side of the display panel (also called one surface side of the display panel). The display panel of one embodiment of the present invention is preferred also in the case of insufficient external light on the user side, for example, in use of a wearable display or the like.

Display performed using a light-emitting element is preferred because it exhibits high visibility even in a dark place.

With the display panel of one embodiment of the present invention, a user can view an image or information displayed on a display panel well irrespective of surrounding brightness, by switching elements used for display (selecting either a transmissive display element or a light-emitting element to be used for displaying) in accordance with the surrounding brightness or the amount of external light entering the display panel.

The light-emitting element included in the display panel may be a light-emitting element that emits light from only one side (also referred to as a single-side light-emitting element). The display panel may have the single-side light-emitting element and the transmissive display element that are stacked. The single-side light-emitting element may be placed closer to one surface side of the display panel than the transmissive display element is. Alternatively, the transmissive display element may be placed closer to the one surface side of the display panel than the single-side light-emitting element is. When an electrowetting element is used as the transmissive display element, the single-side light-emitting element is preferably closer to the one surface side of the display panel than the transmissive display element is.

The light-emitting element included in the display panel may be a light-emitting element that emits light from the opposite sides (also referred to as a double-side light-emitting element).

Specifically, one embodiment of the present invention is a display panel that transmits external light through a double-side light-emitting element and a transmissive display element, and includes a plurality of double-side light-emitting elements that are driven independently and a plurality of transmissive display elements that are driven independently.

The display panel may include the double-side light-emitting element and the transmissive display element that are stacked.

The display panel with the above structure may include one light-emitting element or two or more light-emitting elements per transmissive display element. For example, preferably, when the number of pixels constituted by transmissive display element(s) and the number of pixels constituted by light-emitting element(s) are equal, display performed using the transmissive display elements and display performed using the light-emitting elements have substantially the same degree of resolution.

In each structure described above, the transmissive display element is preferably an electrochromic element. In each structure described above, the light-emitting element is preferably an EL element.

The display panel in each structure described above may be flexible.

In addition, one embodiment of the present invention is a display device including the display panel having any of the above-described structures, a light-receiving element subjected to external light, and a control circuit to control display performed on the display panel in accordance with the amount of external light entering the light-receiving element.

Furthermore, one embodiment of the present invention is a display device including the display panel having any of the above-described structure, a switch with which at least two states can be changed by a user, and a control circuit to control display performed on the display panel depending on the changed state of the switch.

Note that in this specification, the display device includes in its category a module in which a connector such as an anisotropic conductive film or a Tape Carrier Package (TCP) is attached to a display panel; a module having a TCP at the tip of which a printed wiring board is provided; and a module in which an integrated circuit (IC) is directly mounted on the panel by a Chip On Glass (COG) method.

In accordance with one embodiment of the present invention, a display panel or a display device with low-power consumption can be provided. In accordance with one embodiment of the present invention, a display panel or a display device with high visibility irrespective of surrounding brightness can be provided. Particularly in the case of insufficient external light in use of a wearable display or the like, a display panel or a display device with high visibility irrespective of surrounding brightness can be provided.

DETAILED DESCRIPTION OF THE INVENTION

Figure 1A:
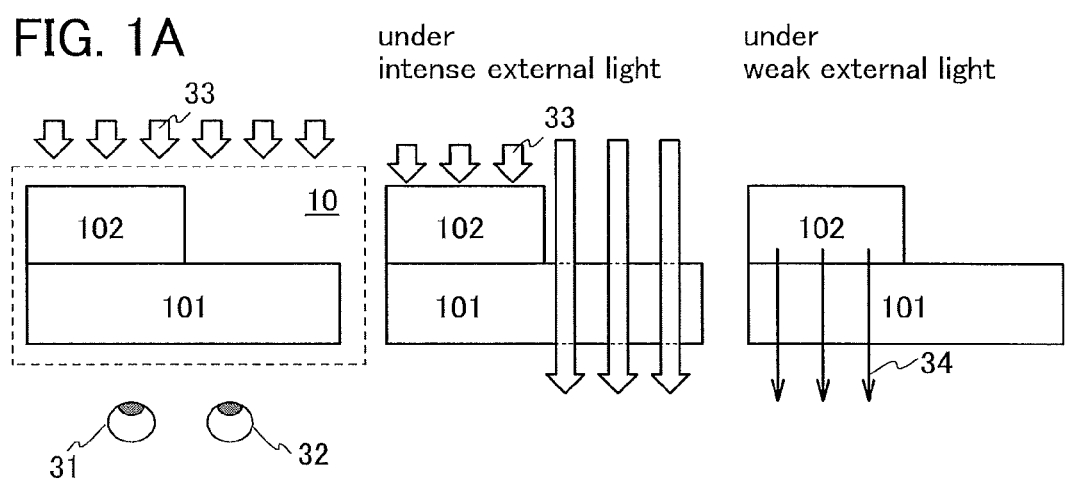
FIGS. 1A to 1D are each a diagram illustrating a display panel of one embodiment of the present invention.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the present invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, the size, the range, or the like disclosed in the drawings and the like.

Embodiment 1

In this embodiment, a display panel of one embodiment of the present invention will be described with reference to FIGS. 1A to 1D, FIGS. 2A to 2E, FIGS. 3A to 3D, and FIGS. 4A to 4E.

The display panel of one embodiment of the present invention is a display panel that can display an image on at least one surface side and transmit external light through a transmissive display element, and includes a plurality of light-emitting elements that can be driven independently and emit light through the one surface side of the display device, and a plurality of transmissive display elements that can be driven independently.

The display panel of one embodiment of the present invention can display an image or information with use of the transmissive display elements and display an image or information with use of the light-emitting elements. With the display panel of one embodiment of the present invention, a user can view a front sight through the transmissive display element in a transmission state or a double-side light-emitting element in a non-light emission state. Moreover, the user can view an image or information displayed on the display panel with the front sight overlapped.

When an image or information is displayed using light-emitting elements, a plurality of light-emitting elements emit light (emission state) or do not emit light (non-emission state) independently from each other.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used. Display performed using such a light-emitting element can exhibit high visibility even in dark surroundings.

The light-emitting element may be an active matrix one or a passive matrix one.

When an image or information is displayed with the transmissive display elements, the plurality of transmissive display elements are each brought independently into a state where visible light is transmitted (transmission state) or a state where visible light is not transmitted (non-transmission state). For example, text or images can be displayed with the user's front sight as the background. Text or images are displayed with use of the elements in the non-transmission state and a portion where the elements are in the transmission state becomes a background.

As the transmissive display element, a display element that can control the amount of visible light to be transmitted can be used; for example, an electrowetting element, an electrochromic element, a transmissive liquid crystal element, a display device using a micro electro mechanical system (MEMS), or the like can be used. The display panel of one embodiment of the present invention uses such transmissive display elements and can display an image or information with use of external light as a light source and achieve low-power consumption.

The transmissive display element may be an active matrix one or a passive matrix one.

External light is not required to enter the display panel (further the transmissive display element) through the surface on the user side of the display panel. The display panel of one embodiment of the present invention is preferred also for the case where a sufficient amount of external light does not enter the display panel from the user side, for example, a wearable display or the like is used.

Furthermore, the display panel of one embodiment of the present invention has flexibility. For example, preferably, an organic EL element is used as the light-emitting element and an electrowetting element or an electrochromic element is used as the transmissive display element. A solid-type organic EL element and a solid-type electrochromic element are preferably used. The display panel of one embodiment of the present invention is preferably flexible, because it can find a wide range of applications.

The display panel of one embodiment of the present invention can be manufactured in such a manner that an active matrix panel using light-emitting elements and an active matrix panel using transmissive display elements are stacked, for example. Alternatively, the display panel of one embodiment of the present invention can be formed in such a manner that a transistor and either one of a light-emitting element and a transmissive display element that is electrically connected to the transistor are formed over a support substrate, a planarization film is formed to cover the transistor and the one of the light-emitting element and the transmissive display element, and a transistor and the other of the light-emitting element and the transmissive display element that is electrically connected to the transistor are formed over the planarization film. Alternatively, a transistor for driving the light-emitting element, and a transistor for driving the transmissive display element may be formed over the same surface.

The display panel of one embodiment of the present invention can switch elements to be used for displaying (select either the transmissive display element or the light-emitting element for displaying) in accordance with the surrounding brightness or the amount of external light entering the display panel. Therefore, a user can view images or information displayed on the display panel irrespective of the surrounding brightness.

Examples of the structure and the display method of the display panel are described below. Specifically, in the display panel in each example, a display method used when the display panel is subjected to intense external light is described as an example where a user can view well display performed by a transmissive display element and a display method used when the display panel is subjected to weak external light is described as an example where a user cannot view well display performed by a transmissive display element.

In each structural, one transmissive display element 101 and one light-emitting element 102 in the display panel are exemplified, but the display panel has a plurality of transmissive display elements 101 and a plurality of light-emitting elements 102, which can be driven independently.

Structural Example 1

The structural example 1 is an example where the transmissive display element 101 has a region not overlapping with the light-emitting element 102 in the planar view. Note that the light-emitting element 102 may have a region not overlapping with the transmissive display element 101 in the planar view.

A display panel 10 illustrated in FIG. 1A includes the transmissive display element 101 and the light-emitting element 102. A part of the transmissive display element 101 overlaps with the light-emitting element 102. The display panel 10 includes the transmissive display element 101 on a user side (left eye 31 and right eye 32). External light 33 enters the display panel 10 from the light-emitting element 102 side. In the example of FIG. 1A, a single-side light-emitting element is used as the light-emitting element 102. Therefore, the external light 33 does not pass through the light-emitting element 102.

The external light 33 can pass through the transmissive display element 101 in the display panel 10. When the external light 33 is intense, display with use of the transmissive display element 101 in the display panel 10 is preferred.

When the external light 33 is weak, display with use of the light-emitting element 102 in the display panel 10 is preferred. The transmissive display element 101 is arranged between the light-emitting element 102 and the user. Thus, when display is performed with use of the light-emitting element 102, the transmissive display element 101 is made to transmit light. Light emission 34 from the light-emitting element 102 goes out through the transmissive display element 101.

Figure 1B:
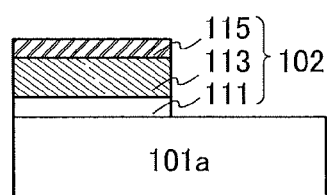

FIG. 1B illustrates an example where an organic EL element is used as the light-emitting element 102. The organic EL element includes a layer 113 containing a light-emitting organic compound (hereinafter referred to as an EL layer) between a pair of electrodes. In FIG. 1B, a first electrode 111 that is arranged on the user side can transmit visible light.

The light-emitting element 102 may be a double-side light-emitting element. In FIG. 1B, a second electrode 115 opposite to the first electrode 111 may transmit visible light.

When the light-emitting element 102 is a double-side light-emitting element, the external light 33 enters a region of a transmissive display element 101a overlapping with the light-emitting element 102 through the light-emitting element 102. Therefore, preferably, the region of the transmissive display element 101a can be used for display. Thus, the difference in brightness between the transmissive display element in a transmission state and the transmissive display element in a non-transmission state is large, so that the display panel can display highly visible images or information with use of the transmissive display element.

As in the structural example 1, when the transmissive display element 101 has a region not overlapping with the light-emitting element 102 in the planar view, the light-emitting element 102 may be a single-side light-emitting element. In FIG. 1B, the second electrode 115 opposite to the first electrode 111 does not need to transmit visible light. An electrode that reflects visible light is preferably used as the second electrode 115, thereby increasing the light-extraction efficiency (outcoupling efficiency). Thus, the difference in brightness between the light-emitting element in an emission state and the light-emitting element in a non-emission state is large, so that the display panel can display highly visible images or information with use of the light-emitting element.

FIG. 1B illustrates an example where the transmissive display element 101a not having a non-light-transmissive portion in a transmission state is used as a transmissive display element. As the transmissive display element 101a, an electrochromic element is preferably used. Because the electrochromic element requires only voltage application to switch from one of a transmission state and a non-transmission state to the other, voltage is not required to be constantly applied to maintain either state. Accordingly, the power consumption of the display panel can be reduced. In addition, the electrochromic element does not need a polarizing plate.

Figure 1C:
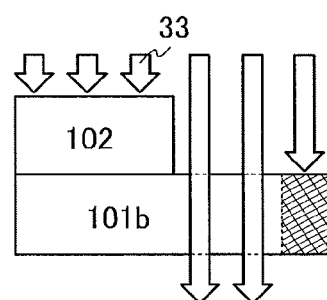
Figure 1D:
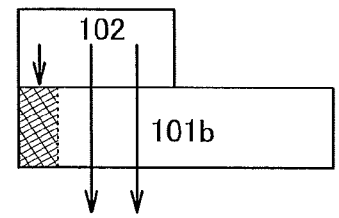

FIGS. 1C and 1D illustrate examples where a transmissive display element 101*b* a part of which is a non-light-transmissive portion even in a transmission state is used as the transmissive display element. An example of the transmissive display element 101*b* is an electrowetting element.

When the light-emitting element 102 is a double-side light-emitting element, the amount of external light passing through the transmissive display element 101*b* the part of which is a non-light-transmissive portion even in a transmission state is smaller than the amount of external light passing through the transmissive display element 101*a* not having a non-light-transmissive portion in a transmission state.

When the light-emitting element 102 is a single-side light-emitting element and the non-light-transmissive portion does not overlap with the light-emitting element 102 (FIG. 1C), the amount of external light passing through the transmissive display element 101*b* is smaller than the amount of external light passing through the transmissive display element 101*a*.

When the light-emitting element 102 is a single-side light-emitting element and the non-light-transmissive portion overlaps with the light-emitting element 102 (FIG. 1D), the amount of external light passing through the transmissive display element 101*a* and the amount of external light passing through the transmissive display element 101*b* are substantially equal. When the transmissive display element 101*b* is used, however, the amount of light outgoing from the light-emitting element 102 in an emission state is smaller than the amount of light outgoing from the light-emitting element 102 when the transmissive display element 101*a* is used.

As the amount of external light passing through the transmissive display element is increased, the difference in brightness between the transmission state and the non-transmission state in the transmissive display element is increased. As the amount of light emitted from the light-emitting element is increased, the difference in brightness between the emission state and the non-emission state in the light-emitting element is increased. Therefore, the transmissive display element 101*a* not having a non-light-transmissive portion in a transmission state is preferably used for the transmissive display element 101 in the structural example 1.

When the transmissive display element 101 is used for display in the structural example 1, the driving state of the light-emitting element 102 does not matter. The amount of light passing through the transmissive display element can be increased with use of the light-emitting element 102 in an emission state. When the double-side light-emitting element is used, a user can see easily the front view in a non-emission state of the light-emitting element.

Structural Example 2

The structural example 2 is an example where the transmissive display element 101 has a region not overlapping with the light-emitting element 102 in the planar view. Note that the light-emitting element 102 may have a region not overlapping with the transmissive display element 101 in the planar view.

Figure 2A:
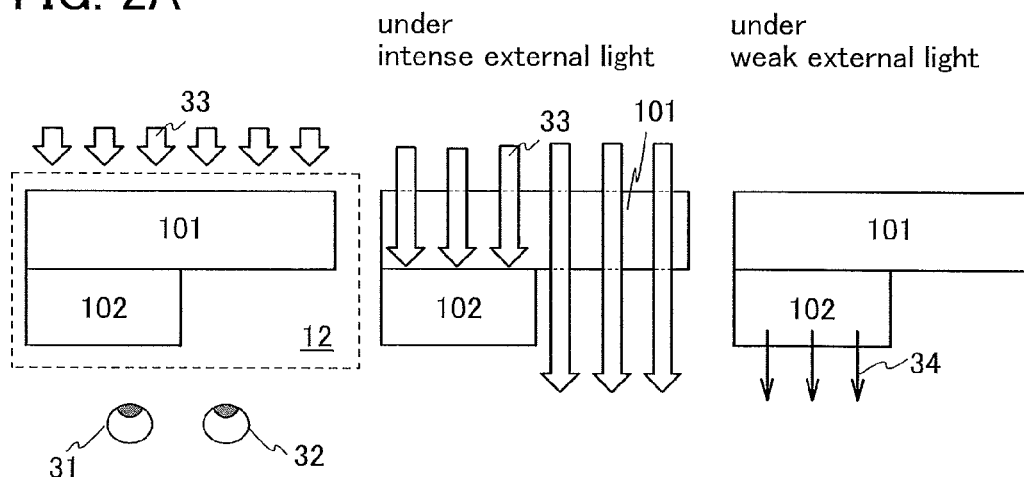
FIGS. 2A to 2E are each a diagram illustrating a display panel of one embodiment of the present invention.

A display panel 12 illustrated in FIG. 2A includes the transmissive display element 101 and the light-emitting element 102. A part of the transmissive display element 101 overlaps with the light-emitting element 102. The display panel 12 includes the light-emitting element 102 on a user side (left eye 31 and right eye 32). External light 33 enters the display panel 12 on the transmissive display element 101 side. In the example of FIG. 2A, a single-side light-emitting element is used as the light-emitting element 102. Therefore, the external light 33 does not pass through the light-emitting element 102.

The external light 33 can pass through the transmissive display element 101 in the display panel 12. When the external light 33 is intense, display with use of the transmissive display element 101 in the display panel 12 is preferred.

When the external light 33 is weak, display with use of the light-emitting element 102 in the display panel 12 is preferred.

Figure 2B:
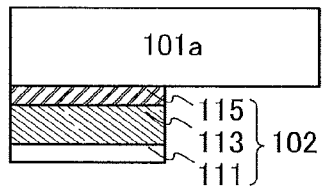

FIG. 2B illustrates an example where an organic EL element is used as the light-emitting element 102. In FIG. 2B, the first electrode 111 that is arranged on the user side can transmit visible light.

The light-emitting element 102 may be a double-side light-emitting element. In FIG. 2B, a second electrode 115 opposite to the first electrode 111 may transmit visible light.

When the light-emitting element 102 is a double-side light-emitting element, the external light 33 enters a region of the transmissive display element 101*a* overlapping with the light-emitting element 102 in the display panel 12. Therefore, preferably, the region of the transmissive display element 101*a* can be used for display. Thus, the difference in brightness between the transmissive display element in a transmission state and the transmissive display element in a non-transmission state is large, so that the display panel can display highly visible images or information with use of the transmissive display element.

Also in the structural example 2, the light-emitting element 102 may be a single-side light-emitting element as in the structural example 1. Refer to the description of the structural example 1 for details thereof.

Figure 2C:
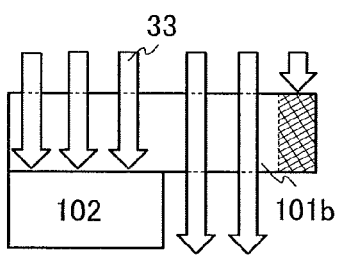
Figure 2D:
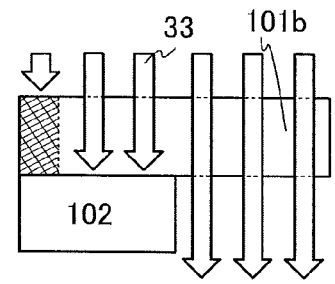

FIG. 2B illustrates an example where the transmissive display element 101*a* not having a non-light-transmissive portion in a transmission state is used as a transmissive display element. FIGS. 2C and 2D illustrate examples where the transmissive display element 101*b* a part of which is a non-light-transmissive portion even in a transmission state is used as the transmissive display element.

When the light-emitting element 102 is a double-side light-emitting element, the amount of external light passing through the transmissive display element 101*b* the part of which is a non-light-transmissive portion even in a transmission state is smaller than the amount of external light passing through the transmissive display element 101*a* not having a non-light-transmissive portion in a transmission state.

When the light-emitting element 102 is a single-side light-emitting element and the non-light-transmissive portion does not overlap with the light-emitting element 102 (FIG. 2C), the amount of external light passing through the transmissive display element 101*b* is smaller than the amount of external light passing through the transmissive display element 101*a*.

When the light-emitting element 102 is a single-side light-emitting element and the non-light-transmissive portion overlaps with the light-emitting element 102 (FIG. 2D), the amount of external light passing through the transmissive display element 101*a* and the amount of external light passing through the transmissive display element 101*b* are substantially equal.

Note that the amount of light outgoing from the light-emitting element 102 in an emission state does not depend on the presence or location of the non-light-transmissive portion of the transmissive display element in a transmission state.

Therefore, the transmissive display element 101a not having the non-light-transmissive portion in a transmission state is preferably used for the transmissive display element 101 in the structural example 2. When the light-emitting element 102 is a single-side light-emitting element, the non-light-transmissive portion of the transmissive display element 101b preferably overlaps with the light-emitting element 102 as illustrated in FIG. 2D.

Note that the light-emitting element 102 is preferably in a non-emission state in the structural example 2, when the transmissive display element 101 is used to display images or information. In this manner, display performed with use of the transmissive display element 101 can be easily viewed by a user.

Structural Example 3

The structural example 3 is an example where the transmissive display element 101 does not overlap with the light-emitting element 102 in the planar view.

Figure 2E:
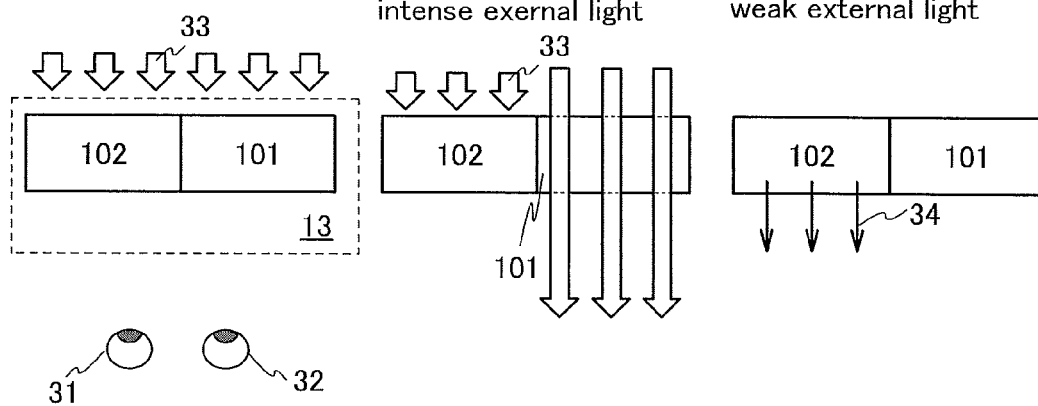

A display panel 13 illustrated in FIG. 2E includes the transmissive display element 101 and the light-emitting element 102. The external light 33 can pass through the transmissive display element 101 in the display panel 13. When the external light 33 is intense, display with use of the transmissive display element 101 in the display panel 13 is preferred. When the external light 33 is weak, display with use of the light-emitting element 102 in the display panel 13 is preferred.

As illustrated in FIG. 2E, in the display panel 13, a single-side light-emitting element where an electrode arranged on the side opposite to the user side reflects visible light may be used as the light-emitting element 102. In this manner, the difference in brightness between the light-emitting element in the emission state and the light-emitting element in the non-emission state is large, so that the display panel can display highly visible images or information with use of the light-emitting elements. The light-emitting element 102 is preferably in a non-emission state, when the transmissive display element 101 is used to display images or information. In this manner, display performed with use of the transmissive display element 101 can be easily viewed by a user.

The double-side light-emitting element may be used as the light-emitting element 102 in the display panel 13. While display is performed with use of the transmissive display element 101, the light-emitting element 102 is made to be in a non-emission state and thereby a user can see the front view through the light-emitting element 102.

As the transmissive display element 101, the transmissive display element not having a non-light-transmissive portion in a transmission state is preferably used, and thereby the amount of external light passing through the transmissive display element 101 in a transmission state is increased as compared with the case where the transmissive display element having a non-light-transmissive portion in a transmission state is used. While display is performed with use of the light-emitting element 102, the state of the transmissive display element 101 does not matter (may be in a transmission state or a non-transmission state).

Structural Example 4

The structural example 4 is an example where the entire transmissive display element 101 overlaps with the light-emitting element 102 in the planar view. In the planar view, the light-emitting element 102 may have a region not overlapping with the transmissive display element 101.

Figure 3A:
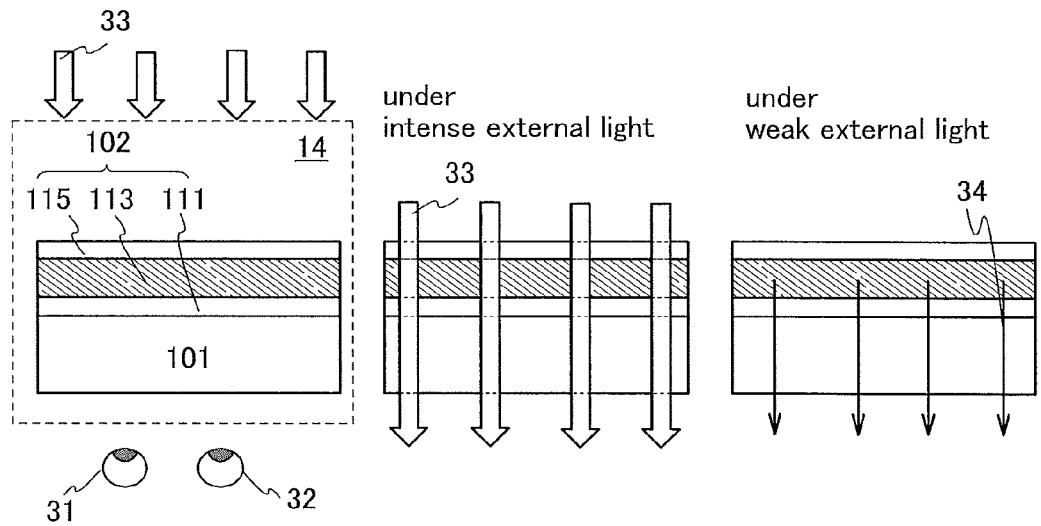
FIGS. 3A to 3D are each a diagram illustrating a display panel of one embodiment of the present invention.

The display panel 14 illustrated in FIG. 3A includes the transmissive display element 101 and the light-emitting element 102. The display panel 14 includes the transmissive display element 101 on a user side (left eye 31 and right eye 32). External light 33 enters the display panel 14 from the light-emitting element 102 side.

The light-emitting element 102 included in the display panel 14 is a double-side light-emitting element. The first electrode 111 on the user side and the second electrode 115 opposite to the first electrode 111 transmit visible light.

Because the light-emitting element 102 is a double-side light-emitting element, the external light 33 enters the transmissive display element 101 through the light-emitting element 102. When the external light is intense, display performed with use of the transmissive display element 101 is preferred in the display panel 14.

When the external light 33 is weak, display with use of the light-emitting element 102 in the display panel 14 is preferred. Between the light-emitting element 102 and a user, the transmissive display element 101 is placed. Therefore, when display is performed with use of the light-emitting element 102, the transmissive display element 101 is in a transmission state. Light emission 34 from the light-emitting element 102 goes out through the transmissive display element 101.

Note that the driving state of the light-emitting element 102 does not matter when display is performed with use of the transmissive display element 101 in the structural example 4. The amount of light passing through the transmissive display element can be increased with use of the light-emitting element 102 in an emission state. When the double-side light-emitting element is used, a user can see easily the front view in a non-emission state.

Structural Example 5

The structural example 5 is an example where the entire transmissive display element 101 overlaps with the light-emitting elements 102 in the planar view. In the planar view, the light-emitting element 102 may have a region not overlapping with the transmissive display element 101.

Figure 3B:
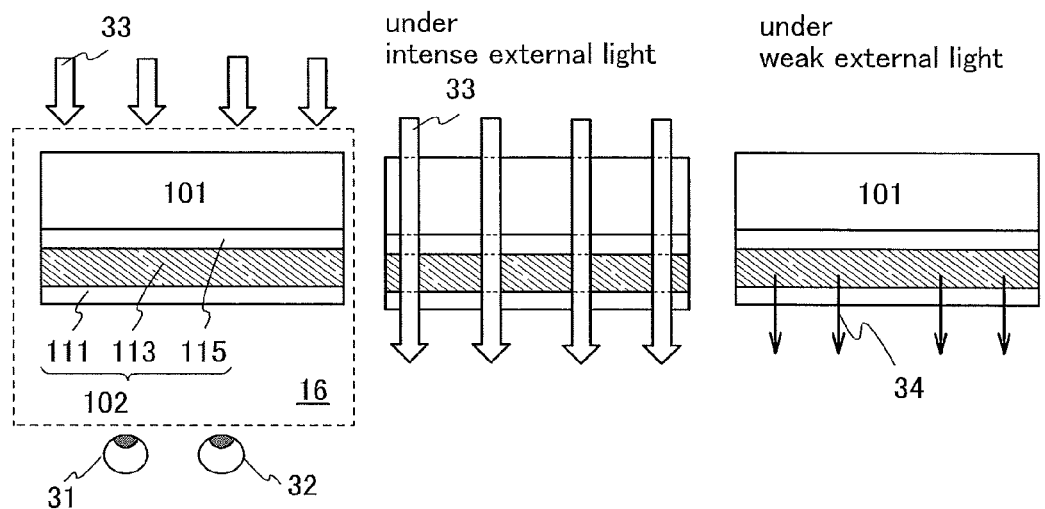

The display panel 16 illustrated in FIG. 3B includes the transmissive display element 101 and the light-emitting element 102. The display panel 16 includes the light-emitting element 102 on a user side (left eye 31 and right eye 32). The external light 33 enters the display panel 16 from the transmissive display element 101 side.

The display panel 16 can transmit the external light 33 through the transmissive display element 101. When the external light 33 is intense, display with use of the transmissive display element 101 in the display panel 16 is preferred. At this time, the light-emitting element 102 is in a non-emission state.

When the external light 33 is weak, display with use of the light-emitting element 102 in the display panel 16 is preferred. At this time, the state of the transmissive display element 101 does not matter (may be in a transmission state or a non-transmission state).

The light-emitting element 102 included in the display panel 16 is a double-side light-emitting element. The first electrode 111 on the user side and the second electrode 115 opposite to the first electrode 111 transmit visible light.

Figure 3C:
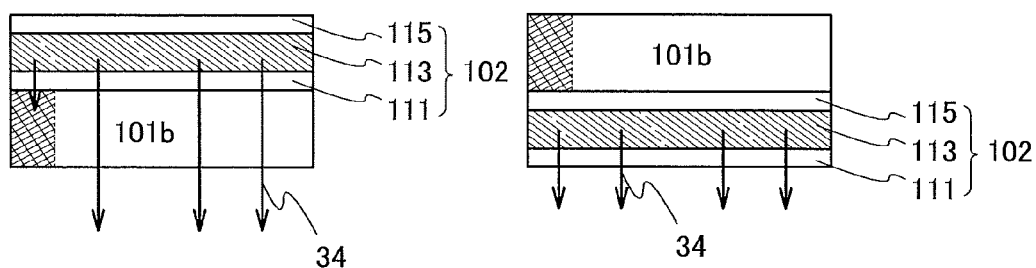
Figure 3D:
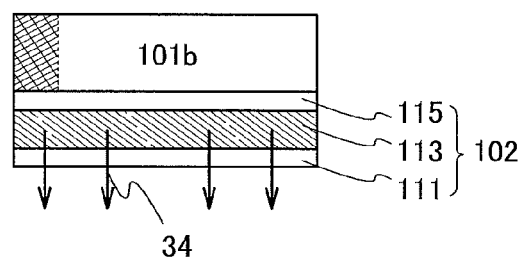

FIG. 3C illustrates an example where the transmissive display element 101b is applied to the structural example 4 and FIG. 3D illustrates an example where the transmissive display element 101b is applied to the structural example 5. As illustrated in FIGS. 3C and 3D, the amount of light outgoing from the light-emitting element 102 in an emission state in the structural example 5 is increased as compared with that in the structural example 4. Thus, the structural example 5 is preferred.

In the structural example 4 and the structural example 5, there are no particular limitations on an element used for the transmissive display element. However, in light of the above description, the structural example 5 is preferably employed for the case where the transmissive display element 101b is used for the display panel.

<Planar Layout>

An example where one of the transmissive display element 101 and the light-emitting element 102 has a region not overlapping with the other of the transmissive display element 101 and the light-emitting element 102 in a planar layout is described below. In FIGS. 4A to 4E, one pixel is surrounded by a two-dot chain line.

The display panel may have one display element or two or more display elements for one transmissive display element. The number of pixels constituted by the light-emitting elements may be equal as or different from the number of pixels constituted by the transmissive display elements.

The shapes of the transmissive display element 101 and the light-emitting element 102 may be any shape. For example, in FIGS. 4A to 4E, rectangles are illustrated, and other quadrangles may be employed or polygonal shapes other than quadrangles may be employed.

Figure 4A:
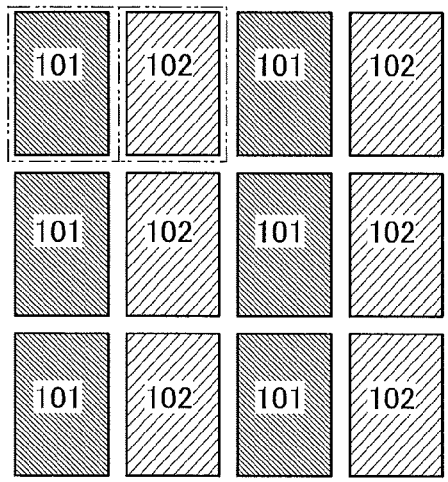
FIGS. 4A to 4E are each a diagram illustrating a display panel of one embodiment of the present invention.

FIG. 4A illustrates an example where one light-emitting element 102 is provided with respect to one transmissive display element 101. Display performed with use of the transmissive display element 101 and display performed with use of the light-emitting element 102 are both monochrome display.

In FIG. 4A, one pixel includes one light-emitting element 102 or one transmissive display element 101. Whether the light-emitting element or the transmissive display element is used, the display panel can display images and the like with similar level of resolution.

Figure 4B:
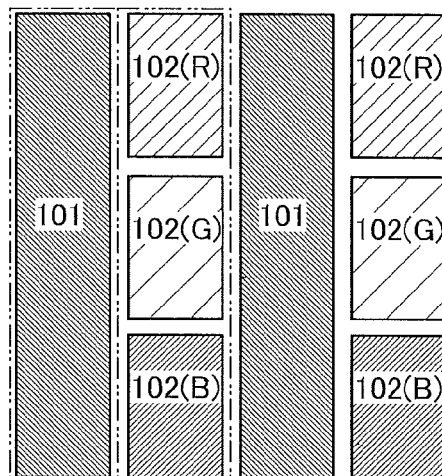

FIG. 4B illustrates an example where three light-emitting elements 102 are provided with respect to one transmissive display element 101. Display performed with use of the transmissive display element 101 is monochrome display. The light-emitting elements are a red light-emitting element 102(R), a green light-emitting element 102(G), and a blue light-emitting element 102(B) that are formed separately by a separate coloring method or with color filters. Display performed with use of the light-emitting elements is full-color display.

In FIG. 4B, one pixel includes three display elements 102 or one transmissive display element 101. Whether the light-emitting element or the transmissive display element is used, the display panel can display images and the like with similar level of resolution.

Figure 4C:
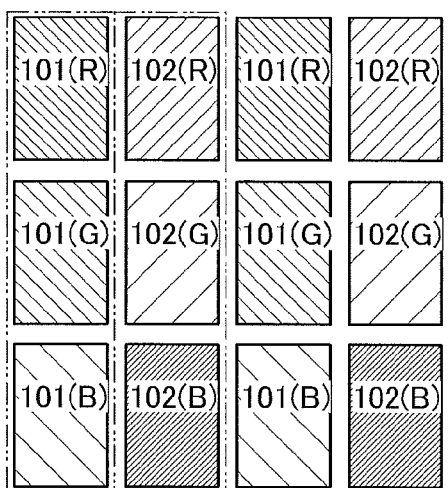

In FIG. 4C, the transmissive display elements are also formed to be a red transmissive display element 101(R), a green transmissive display element 101(G), and a blue transmissive display element 101(B) with use of color filters or the like. Display performed with user of the transmissive display elements is full-color display. The structure of the light-emitting element is similar to that in FIG. 4B.

In FIG. 4C, one pixel includes three light-emitting elements 102 or three transmissive display elements 101. Whether the light-emitting element or the transmissive display element is used, the display panel can display images and the like with similar level of resolution.

Figure 4D:
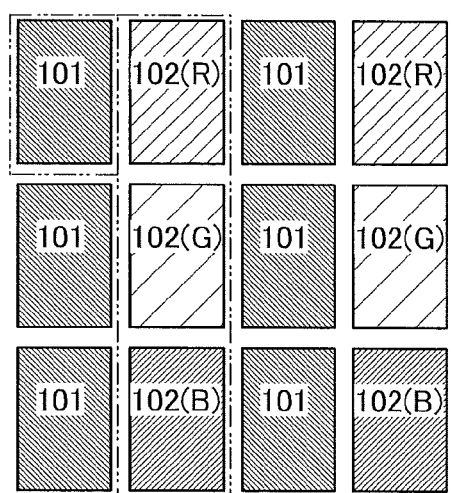

FIG. 4D illustrates an example where one transmissive display element is provided with respect to three light-emitting elements. One pixel includes three light-emitting elements or one transmissive display element. In FIG. 4D, the resolution of display performed with use of the transmissive display element is higher than that of display performed with use of the light-emitting elements.

Figure 4E:
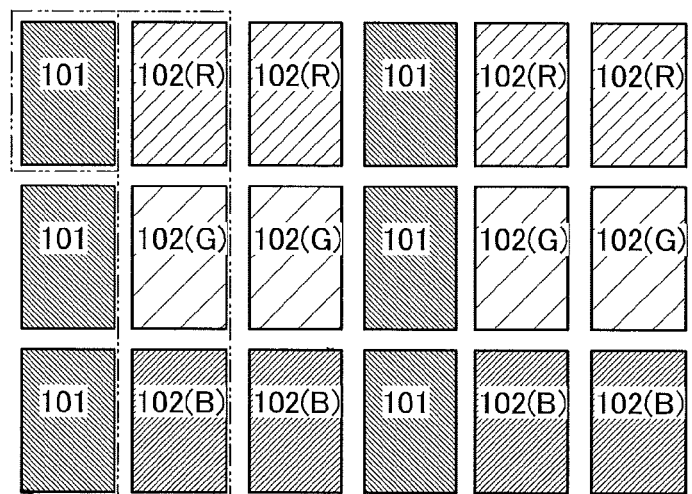

FIG. 4E illustrates an example where one transmissive display element is provided with respect to two light-emitting elements. One pixel includes three light-emitting elements or one transmissive display element.

This embodiment can be combined with any other embodiment as appropriate.

Embodiment 2

In this embodiment, a display device in accordance with one embodiment of the present invention will be described with reference to FIGS. 5A to 5C. The display device in accordance with one embodiment of the present invention has any of the display panels described in Embodiment 1. Therefore, a user can view images and the like displayed on the display device well, not depending on the surrounding brightness.

Structural Example 1

One embodiment of the present invention is a display device where an element to be used for display is selected depending on the surrounding brightness. The display device in accordance with one embodiment of the present invention includes the display panel, an illuminance sensor that measures surrounding brightness, and a control circuit that changes display performed on the display panel depending on the measurement result by the illuminance sensor. A display device having a light-receiving element subjected to external light is described below as an example.

Figure 5A:
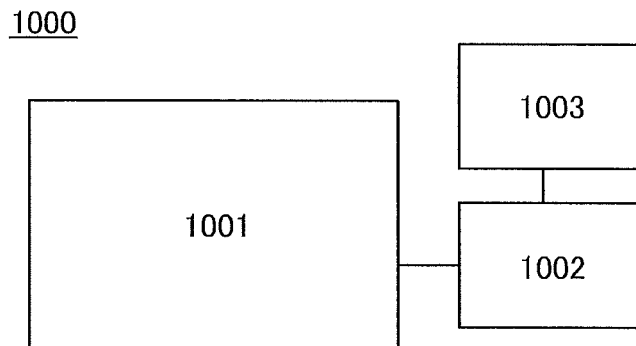
FIGS. 5A to 5C are each a diagram illustrating a display device of one embodiment of the present invention.

A display device 1000 illustrated in FIG. 5A includes a display panel 1001, a control circuit 1002, and a light-receiving element 1003.

Any of the display panels described in Embodiment 1 can be used for the display panel 1001.

The control circuit 1002 can control the display panel 1001. Specifically, the control circuit 1002 selects an element used for the display performed on the display panel 1001 (selects display performed with use of the transmissive display element or the light-emitting element in the display panel 1001).

External light enters the light-receiving element 1003. One or a plurality of light-receiving elements 1003 may be provided. One light-receiving element may receive at least either external light from one side (a display surface side) of the display panel 1001 or external light from the other side opposite to the display surface side of the display panel 1001. Preferably, the display device 1000 can measure the amount of external light from the both sides with use of one light-receiving element or a plurality of light-receiving elements.

In the display device 1000 illustrated in FIG. 5A, the control circuit 1002 can control the display panel 1001 in such a manner that when the amount of light entering the light-receiving element 1003 is a certain value or higher, display is performed with use of the transmissive display element, and when the amount of light entering the light-receiving element 1003 is smaller than the certain value, display is performed with use of the light-emitting element.

Structural Example 2

One embodiment of the present invention is a display device where an element to be used for display can be selected by a user. The display device in accordance with one embodiment of the present invention includes a display panel, a switch, a control circuit that changes display performed on the display panel in accordance with the state of the switch.

Figure 5B:
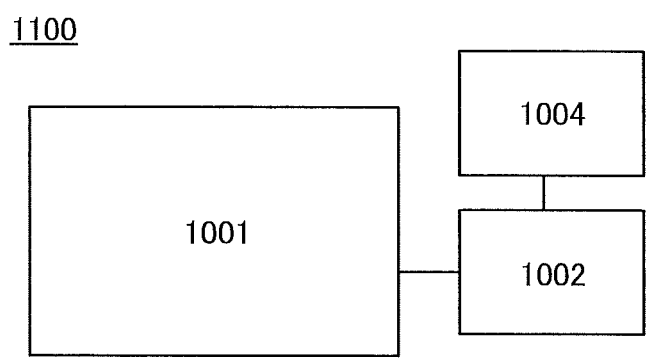

A display device 1100 illustrated in FIG. 5B includes the display panel 1001, the control circuit 1002, and a switch 1004.

Any of the display panels described in Embodiment 1 can be used for the display panel 1001.

The control circuit 1002 can control the display panel 1001. Specifically, the control circuit 1002 selects an element used for the display performed on the display panel 1001 (selects display performed with use of the transmissive display element or the light-emitting element).

The switch 1004 includes at least a first state and a second state, and the state of the switch 1004 can be changed by a user of the display device.

For example, the control circuit 1002 may control the display panel 1001 in such a manner that in the display device 1100 illustrated in FIG. 5B, when the switch 1004 is in the first state, display is performed with use of the transmissive display element, and when the switch 1004 is in the second state, display is performed with use of the light-emitting element.

Alternatively, in the display device 1100 illustrated in FIG. 5B, the control circuit 1002 may control the display panel 1001 in such a manner that the state of the switch 1004 is changed to switch the elements to be used for display also in the display panel 1001. For example, the display device 1100 may be configured in such a manner that the element used for display on the display panel 1001 is determined to either the light-emitting element or the transmissive display element when a user starts to use the display device 1100 (the power is turned on), and can be switched to the other thereof as the element used for display by changing the state of the switch 1004 while the user is using it.

Structural Example 3

One embodiment of the present invention is a display device where an element used for display is selected depending on surrounding brightness and a user can decide the element used for display. The display device in accordance with one embodiment of the present invention includes the display panel, a switch, an illuminance sensor that measures surrounding brightness, and a control circuit that changes display performed with use of the display panel depending on the measurement result by the illuminance sensor or the state of the switch.

Figure 5C:
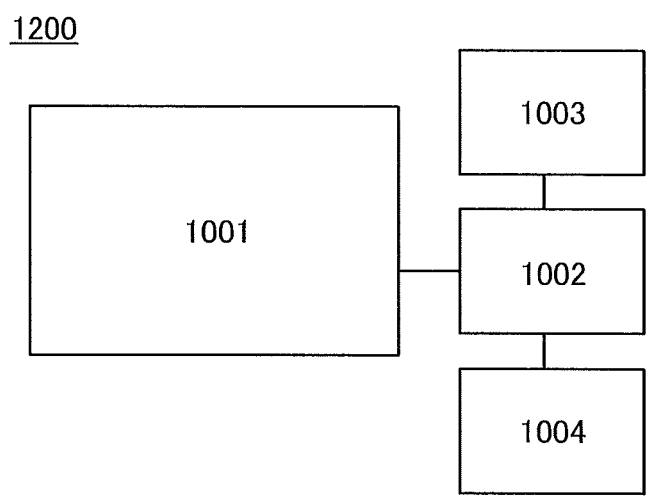

A display device 1200 illustrated in FIG. 5C includes the display panel 1001, the control circuit 1002, the light-receiving element 1003, and the switch 1004.

Any of the display panels described in Embodiment 1 can be used for the display panel 1001.

A light-receiving element similar to that in the structural example 1 can be used as the light-receiving element 1003.

The control circuit 1002 can control the display panel 1001. Specifically, the control circuit 1002 selects an element used for the display performed on the display panel 1001 (selects display performed with use of the transmissive display element or the light-emitting element in the display panel 1001).

The switch 1004 includes at least a first state and a second state, and the state of the switch is changed by a user of the display device.

For example, in the display device 1200 illustrated in FIG. 5C, the control circuit 1002 can control the display panel 1001 in such a manner that when the amount of light entering the light-receiving element 1003 is a certain value or higher, display is performed with use of the transmissive display element, and when the amount of light entering the light-receiving element 1003 is smaller than the certain value, display is performed with use of the light-emitting element.

Furthermore, in the display device 1200, the control circuit 1002 can control the display panel 1001 in such a manner that the state of the switch 1004 is changed to switch the elements used for display performed also on the display panel 1001.

The display device 1200 may be configured, for example, in such a manner that the element used for display performed on the display panel 1001 is generally selected in accordance with the amount of light entering the light-receiving element 1003 and the element used for display performed on the display panel 1001 is forcibly changed by the state of the switch 1004 changed by a user.

Alternatively, the display device 1200 illustrated in FIG. 5C may be configured in such a manner that the control circuit 1002 can control the display panel 1001 as follows: display is performed with use of the transmissive display element when the switch is in a first state, display is performed with use of the light-emitting element when the switch is in a second state, and the element used for display performed on the display panel 1001 is selected in accordance with the amount of light entering the light-receiving element 1003 when the switch is in a third state.

This embodiment can be combined with any other embodiment as appropriate.

This application is based on Japanese Patent Application serial no. 2013-066119 filed with Japan Patent Office on Mar. 27, 2013, the entire contents of which are hereby incorporated by reference.

What is claimed is:

1. A display device comprising:
   a display panel capable of transmitting external light, the display panel comprising:
      a transmissive display element; and
      a light-emitting element overlapping the transmissive display element, the light-emitting element comprising:
         a first electrode capable of transmitting visible light;
         a second electrode; and
         an electroluminescent layer between the first electrode and the second electrode,
   wherein the transmissive display element and the light-emitting element overlap with each other, and
   wherein the transmissive display element comprises:
      a first region overlapping with the light-emitting element; and
      a second region overlapping with none of the first electrode, the second electrode, and the electroluminescent layer.

2. The display device according to claim 1, wherein the second electrode is capable of reflecting visible light.

3. The display device according to claim 1, wherein the transmissive display element comprises a non-light-transmissive portion.

4. The display device according to claim 1, wherein the transmissive display element is an electrochromic element.

5. The display device according to claim 1, wherein the transmissive display element is an electrowetting element.

6. The display device according to claim 1, wherein the transmissive display element is a liquid crystal element.

7. The display device according to claim 1, further comprising:
a control circuit; and
a light-receiving element,
wherein the control circuit is configured to control display on the display panel in response to the light-receiving element.

8. A display device comprising:
a display panel capable of transmitting external light, the display device panel comprising:
a transmissive display element; and
a light-emitting element comprising:
a first electrode capable of transmitting visible light;
a second electrode capable of transmitting visible light; and
an electroluminescent layer between the first electrode and the second electrode,
wherein the transmissive display element and the light-emitting element are positioned side by side.

9. The display device according to claim 8, wherein the transmissive display element comprises a non-light-transmissive portion.

10. The display device according to claim 8, wherein the transmissive display element is an electrochromic element.

11. The display device according to claim 8, wherein the transmissive display element is an electrowetting element.

12. The display device according to claim 8, wherein the transmissive display element is a liquid crystal element.

13. The display device according to claim 8, further comprising:
a control circuit; and
a light-receiving element,
wherein the control circuit is configured to control display on the display panel in response to the light-receiving element.

14. A display device comprising:
a display panel comprising:
a display element; and
a light-emitting element overlapping the display element, the light-emitting element comprising:
a first electrode;
a second electrode; and
an electroluminescent layer between the first electrode and the second electrode,
wherein the display element and the light-emitting element overlap with each other, and
wherein the display element comprises:
a first region overlapping with the light-emitting element; and
a second region overlapping with none of the first electrode, the second electrode, and the electroluminescent layer.

15. The display device according to claim 14, wherein the second electrode is capable of reflecting visible light.

16. The display device according to claim 14, wherein the display element comprises a non-light-transmissive portion.

17. The display device according to claim 14, wherein the display element is an electrochromic element.

18. The display device according to claim 14, wherein the display element is an electrowetting element.

19. The display device according to claim 14, wherein the display element is a liquid crystal element.

20. The display device according to claim 14, further comprising:
a control circuit; and
a light-receiving element,
wherein the control circuit is configured to control display on the display panel in response to the light-receiving element.

* * * * *

UNITED STATES PATENT AND TRADEMARK OFFICE
CERTIFICATE OF CORRECTION

PATENT NO. : 9,715,103 B2
APPLICATION NO. : 14/224742
DATED : July 25, 2017
INVENTOR(S) : Kaoru Hatano Page 1 of 1

It is certified that error appears in the above-identified patent and that said Letters Patent is hereby corrected as shown below:

In the Claims

Column 15, Line 19, Claim 8; Change "display device panel" to --display panel--.

Signed and Sealed this
Second Day of January, 2018

Joseph Matal
*Performing the Functions and Duties of the*
*Under Secretary of Commerce for Intellectual Property and*
*Director of the United States Patent and Trademark Office*